(12) United States Patent
Yang et al.

(10) Patent No.: US 12,310,241 B2
(45) Date of Patent: May 20, 2025

(54) FLEXIBLE PATTERNED PIEZOCERAMIC COMPOSITE AND MANUFACTURING METHOD THEREOF

(71) Applicant: City University of Hong Kong, Hong Kong (CN)

(72) Inventors: Zhengbao Yang, Hong Kong (CN); Ying Hong, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 591 days.

(21) Appl. No.: 17/653,885

(22) Filed: Mar. 8, 2022

(65) Prior Publication Data

US 2023/0292617 A1    Sep. 14, 2023

(51) Int. Cl.
*H10N 30/092* (2023.01)
*H10N 30/045* (2023.01)
*H10N 30/06* (2023.01)
*H10N 30/078* (2023.01)
(Continued)

(52) U.S. Cl.
CPC ......... *H10N 30/078* (2023.02); *H10N 30/045* (2023.02); *H10N 30/06* (2023.02); *H10N 30/092* (2023.02); *H10N 30/852* (2023.02); *H10N 30/877* (2023.02)

(58) Field of Classification Search
CPC .... H10N 30/06; H10N 30/078; H10N 30/092; H10N 30/852; H10N 30/877; H10N 30/704; H10N 30/077; Y10T 29/42
See application file for complete search history.

(56) References Cited

U.S. PATENT DOCUMENTS 5,539,965 A * 7/1996 Safari ................. H10N 30/092
                                                     29/25.35
8,561,270 B2 * 10/2013 Suarez ................ H10N 30/206
                                                     29/25.35
(Continued)

FOREIGN PATENT DOCUMENTS

EP         1235284 B1 * 10/2008  ........... B64C 27/615

OTHER PUBLICATIONS

Cui et al., "Three-dimensional printing of piezoelectric materials with designed anisotropy and directional response", in Nature Materials 183 (18), 2019, p. 234-241.
(Continued)

*Primary Examiner* — Donghai D Nguyen
(74) *Attorney, Agent, or Firm* — S&F/WEHRW

(57) ABSTRACT

The present invention provides a surface tension assisted film forming method to prepare a flexible, patterned piezoceramic composite for use in a variety of electronics. The present method allows tuning mechanical and piezoelectric properties of the resulting composite by simply adjusting one or few parameters used during the piezoceramic film forming and/or composite forming procedures in the absence of any complex transferring techniques that are commonly used in conventional methods. The present invention also allows customizing patterns (two-dimensional or three-dimensional) on the piezoceramic framework to result in a piezoelectric composite that is able to provide anisotropic piezoelectric responses to different loads whilst still having a constant electrical output over a long-time deformation.

19 Claims, 9 Drawing Sheets

(51) Int. Cl.
*H10N 30/85* (2023.01)
*H10N 30/87* (2023.01)

(56) References Cited

U.S. PATENT DOCUMENTS 11,968,904 B2 * 4/2024 Yang ...................... H10N 30/06
2016/0181506 A1 6/2016 Sirbuly et al.

OTHER PUBLICATIONS

Lee et al., "High-performance piezoelectric nanogenerators based on chemically-reinforced composites", in Energy & environmental science 11, 2018, p. 1425-1430.

Ma et al., "Flexible Porous Polydimethylsiloxane/Lead Zirconate Titanate-Based Nanogenerator Enabled by the Dual Effect of Ferroelectricity and Piezoelectricity", in ACS Applied Material Interfaces 10, 2018.

Lee et al., "Flexible Nanocomposite Generator Made of BaTiO3 Nanoparticles and Graphitic Carbons", in Advanced Material 24, 2012, p. 2999-3004.

Zhang et al., "Flexible three-dimensional interconnected piezoelectric ceramic foam based composites for highly efficient concurrent mechanical and thermal energy harvesting", in Energy & Environmental Science 11(8), 2018, p. 2046-2056.

Xie et al., "Flexible and active self-powered pressure, shear sensors based on freeze casting ceramic-polymer composites", in Energy & environmental science 11(10), 2018, p. 2919-2927.

* cited by examiner

FLEXIBLE PATTERNED PIEZOCERAMIC COMPOSITE AND MANUFACTURING METHOD THEREOF

TECHNICAL FIELD

The present invention relates to a flexible, patterned piezoceramic composite prepared by a surface tension assisted film forming method. In particular, the present composite is prepared by a sol-gel method based on surface tension effect of piezoelectric liquids on a solid frame to form a piezoceramic film.

BACKGROUND

Over the past few decades, wearable and implantable devices have attracted considerable attention in extensive research areas such as biomedical treatments and intelligent electronics. The demand for user comfort and battery endurance has urged researchers to explore flexible electronics and energy harvesting technologies, in which piezoelectric materials play a key role. Piezoelectric ceramics such as lead zirconate titanate (PZT) and barium titanate (BTO) demonstrate high electrical output under mechanical excitations, but the high stiffness and brittleness greatly limit their applications in the scenarios demanding flexibility (e.g., wearable electronics). Piezoelectric polymers such as PVDF, though have a relatively low elastic modulus, are weak in piezoelectricity and hard to form thick elements. An effective approach toward flexible piezoelectric materials is infiltrating piezoelectric ceramic nanostructures into polymers. However, in such hybrid composites, the stiffness mismatch and spatial discontinuity between ceramic fillers and polymer matrix greatly hinder the force transmitting, leading to the degradation of their piezoelectric performance. Moreover, the piezoceramic fillers in the composites are usually ineffectively polarized as the polarization field tends to traverse across the polymer matrix because of the permittivity difference between ceramic fillers and polymer matrix, which further reduces the electrical output.

Many efforts have been made to improve the piezoelectric response of piezoceramic composites from different aspects including (1) Surface modification: for instance, Cui et al., ("Three-dimensional printing of piezoelectric materials with designed anisotropy and directional response", in Nature Materials 183 (18), 2019, page 234-241) prepared functionalized PZT nanoparticle colloids which are then covalently bonded with entrapped photo-active monomers to enhance the stress applied to the PZT NPs; (2) Uniform distribution: Lee et al. ("High-performance piezoelectric nanogenerators based on chemically-reinforced composites", in Energy & environmental science 11, 2018, page 1425-1430) fabricated composite thin films containing a uniform distributed amine-functionalized PZT nanoparticles within the polymer matrix, which shows an enhanced force transmitting; (3) Modulus adjusting: Ma et al. ("Flexible Porous Polydimethylsiloxane/Lead Zirconate Titanate-Based Nanogenerator Enabled by the Dual Effect of Ferroelectricity and Piezoelectricity", in ACS Applied Material Interfaces 10, 2018) reported a flexible porous piezoelectric composite with relatively low elastic modulus and large electrical output. A porous nanoparticle-polymer 0-3 composite structure was described in U.S. Patent Application Publication No. 2016/0181506 A1, with a predetermined amount of sugar used to control porosity of the porous structure up to 73%; (4) Permittivity adjusting: Lee et al. ("Flexible Nanocomposite Generator Made of $BaTiO_3$ Nanoparticles and Graphitic Carbons", in Advanced Material 24, 2012, page 2999-3004) introduced carbon nanomaterials into the flexible piezoelectric composite film composed of Pb-free piezoelectric nanoparticles and PDMS; (5) Connectivity increase: Besides the methods mentioned above, the increased connectivity of the piezoceramic fillers also leads to the enhancement of piezoelectric response. Based on this concept, Zhang et al. ("Flexible three-dimensional interconnected piezoelectric ceramic foam based composites for highly efficient concurrent mechanical and thermal energy harvesting", in Energy & Environmental Science 11(8), 2018, page 2046-2056) introduced the scalable ceramic-polymer composites based on three-dimensional (3-D) interconnected piezoelectric foams; Xie et al. ("Flexible and active self-powered pressure, shear sensors based on freeze casting ceramic-polymer composites", in Energy & environmental science 11(10), 2018, page 2919-2927) demonstrated a PZT-PDMS composites with aligned pore channels. Besides, U.S. Pat. No. 6,004,500 described a controlled, non-random piezoelectric ceramic composite having 2-3, 3-2 or 3-3 connectivity with respect to the sintered ceramic and the second composition throughout the composite.

However, the aforementioned methods mainly focused on the performance improvement of the whole intrinsically flexible composites, in which the ceramic fillers (i.e., 0D nanoparticles, 1D nanowires, and 3D skeleton) are well dispersed in the whole polymer matrix.

There is a need to develop a new, localized patterning strategy to actively tune the piezoelectric performance and flexibility while eliminating or at least diminishing drawbacks and problems arising from the conventional methods/composites.

SUMMARY OF INVENTION

The present disclosure proposes a patterning strategy on the basis of utilizing the surface tension effect on film forming in order to increase both the flexibility and piezoelectric performance of the composite. Based on the Hooke's law, the strain distribution of a flexible substrate is subject to the stiffness of localized regions, and thus the stiffening of the active regions in flexible sheets can be used to reduce the strain experienced by devices. In particular, flexible electronics can be built using rigid materials connected by interconnects with relatively low elastic modulus. By this strategy, the flexibility of the whole composite is increased through the introduction of elastic interconnects while the piezoelectric performance of stiffened piezo-active regions can be maintained.

Accordingly, a first aspect of the present invention provides a method of making a flexible, patterned piezoelectric composite through a surface tension assisted film forming procedure during a sol-gel process. The present method includes:

providing an organic frame having a plurality of voids or cylinders defined by one or more grids thereof;

providing piezoelectric liquids containing piezoelectric materials to form a sol solution;

immersing the organic frame into the sol solution;

removing the organic frame from the sol solution to air such that the surface tension between the liquids and the grids assists retention of the liquids within the voids or cylinders of the organic frame, thereby forming a liquid film;

patterning the liquid film by a mask with a designated pattern under an airflow followed by drying at a first drying temperature to form a gel precursor;

sintering the gel precursor at a sintering temperature to form a piezoceramic film;

infiltrating the piezoceramic film with a curable liquid polymer solution to form a curable liquid polymer matrix;

drying the piezoceramic film with the curable liquid polymer matrix at a second drying temperature to form a polymer-piezoceramic composite.

In one embodiment, the piezoelectric liquids are provided by sequentially preparing the following three liquids:

a piezoelectric material sol solution;

a surface-modified piezoelectric powder suspension; and a piezoelectric material sol-powder suspension.

In other embodiments, the piezoelectric materials may include one or more of lead zirconate titanate (PZT), barium titanate (BTO), barium titanate doped with calcium and zirconium (BCZT), ZnO, and $Pb(Mg_{1/3}Nb_{2/3})O_3$—$PbTiO_3$ (PMN-PT).

In one embodiment, the piezoelectric material sol solution is prepared by dissolving lead (II) acetate trihydrate in excess into an acetic acid solution, followed by adding zirconium (IV) propoxide and titanium (IV) butoxide into the solution until thoroughly mixed.

In one embodiment, the surface-modified piezoelectric powder suspension is prepared by adding piezoelectric powders and a surfactant solution including but not limited to polyethyleneimine (PEI) respectively into water followed by mixing thoroughly such that the piezoelectric powders are surface-modified by the surfactant.

In one embodiment, the piezoelectric sol-powder suspension is prepared by mixing the surface-modified piezoelectric powder suspension with the piezoelectric material sol solution in a mass ratio of about 4:1 to form a well-dispersed piezoelectric material sol-powder suspension. The as-prepared piezoelectric material sol-powder suspension should be ready for immersing the organic frame according to the present method described herein.

In one embodiment, the first drying temperature used to dry the patterned liquid film is about 70° C. or at a temperature that turns the patterned liquid film into gel state.

In one embodiment, the mask used for the patterning can be made of steel.

In certain embodiments, the designated pattern of the mask is able to provide two-dimensional and three-dimensional patterns in the patterning of the liquid film.

In one embodiment, the sintering temperature used to convert the gel precursor into the piezoceramic film is about 1,000° C. and the sintering is carried out for about 2 hours, or at a temperature and duration that the organic frame is substantially removed.

In certain embodiments, the organic frame is a solid organic frame, and includes one or more of nylon, polylactic acid (PLA), and polyimide (PI).

In one embodiment, the second drying temperature used to dry the piezoceramic film with the curable liquid polymer matrix is about 70° C. and the drying lasts for about 2 hours or at a temperature and duration until the polymer-piezoceramic composite is set.

In certain embodiments, the curable liquid polymer matrix includes one or more of polyvinylidene fluoride (PVDF), polyimide (PI), thermoplastic polyurethane (TPU), styrene ethylene butylene styrene (SEBS), and polydimethylsiloxane (PDMS).

In certain embodiments, the present method further includes coating one or more protective layers and one or more electrodes on the polymer-piezoceramic composite to form a flexible piezoelectric device.

In one embodiment, the electrodes include copper, silver and gold; the electrodes and/or protective layer is/are coated by sputtering or spin-coating.

In one embodiment, the present method further includes applying a high electric field to the composite prior to or after coating thereon one or more protective layers and electrodes. Specifically, polarization such as corona polarization or oil bath polarization is used to treat the composite prior to or after coating the protective layer(s) and electrode(s) thereon.

A second aspect of the present invention provides a polymer-piezoceramic composite prepared by the present method according to various embodiments of the first aspect described herein. The resulting composite may have an elastic modulus from about 10 kPa to 10 GPa. The piezoceramic film after the sintering may have a relative permittivity of about 500 to 7,000. The resulting composite is also capable to receive an electric field greater than coercive field of the piezoceramic film in order to render the composite piezoelectrically active.

A third aspect of the present invention provides a piezoelectric device including the polymer-piezoceramic composite prepared by the present method or those described in various embodiments of the present invention, with electrodes and protective layer(s) coated thereon. The resulting piezoelectric device has substantially the same piezoelectric and mechanical properties as those described in various embodiments of the present invention.

It should be understood that elastic modulus of the present composite is adjustable by selecting suitable polymer(s) to form the polymer matrix and/or varying the ratio between the sintered, patterned liquid film (piezoceramic film) and the curable liquid polymer solution during the infiltration in order to result in a desired elastic modulus. The piezoelectric property of the present composite is tunable by varying the composition of different solutions/suspensions to form the piezoelectric liquids.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

Figure 4:
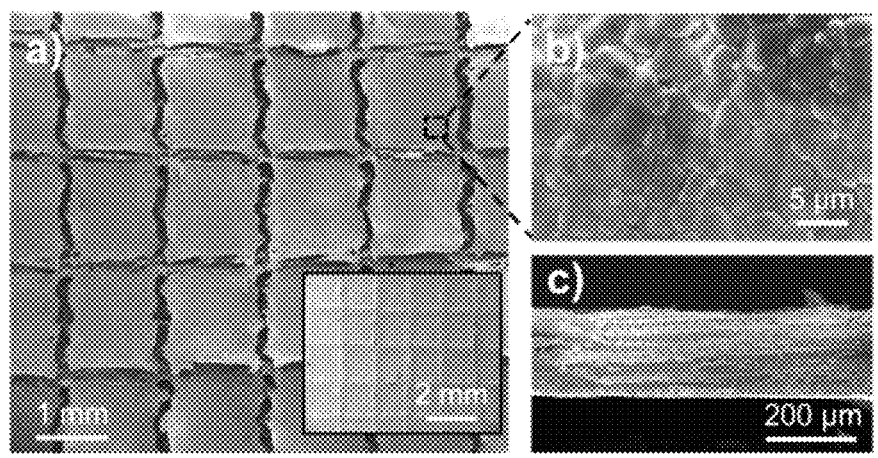
Figure 5:
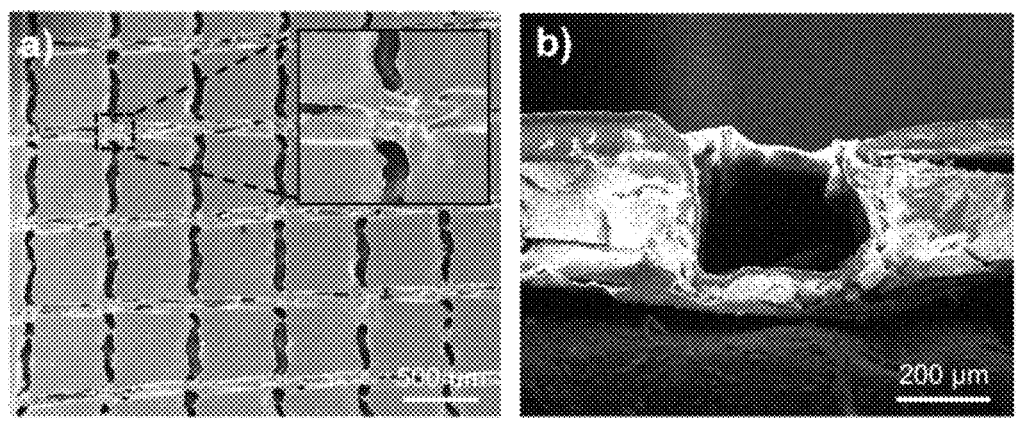
Figure 6:
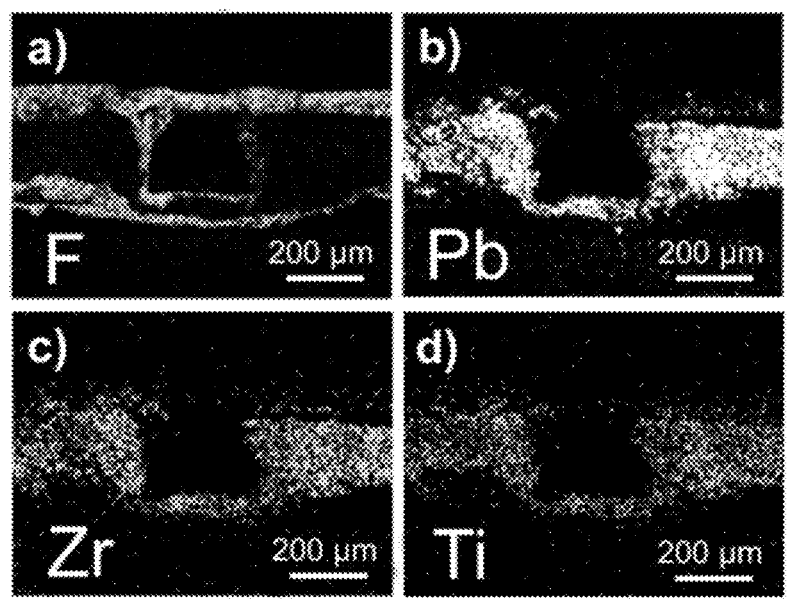
Figure 7:
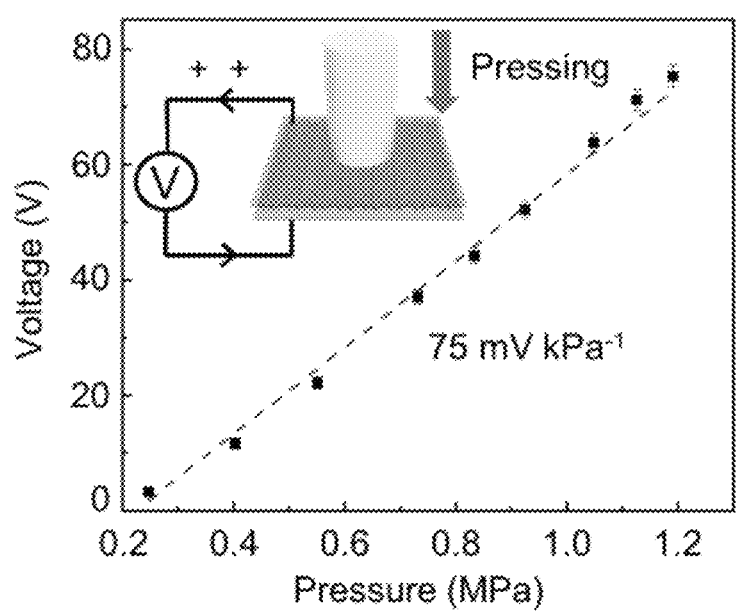
Figure 8:
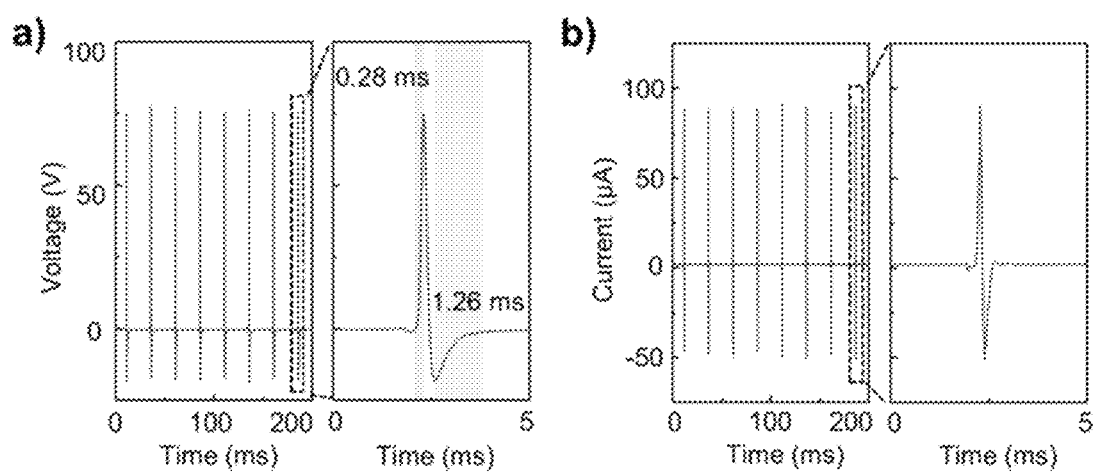
Figure 9:
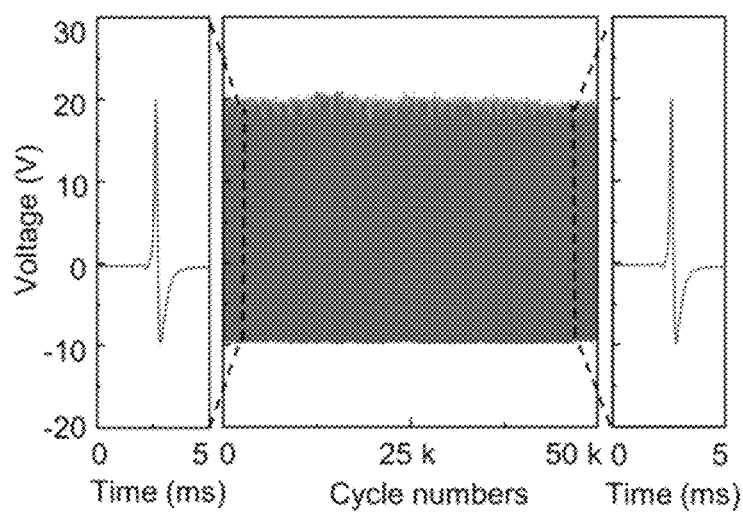

interval (2D pattern); (d) rectangular interval (2D pattern); (e) continuous (3D pattern); (f) interval (3D pattern);

FIG. 4 is a series of SEM images taken from different perspectives and in different magnifications showing morphology or appearance of a patterned piezoceramic framework prepared by the present method according to certain embodiments of the present invention, including: (a) a top view showing a patterned side of the piezoceramic framework with a continuous 2D pattern and a bottom view thereof (the inset); (b) a higher magnification of the top view of the same piezoceramic framework as in (a); (c) a cross-sectional view of the same piezoceramic framework as in (a);

FIG. 5 is a series of SEM images taken from different perspectives and in different magnifications showing morphology or appearance of a polymer-piezoceramic composite prepared by the present method according to certain embodiments of the present invention;

FIG. 6 shows the distribution of different elements in the polymer-piezoceramic composite using energy dispersive spectroscopic (EDS) mapping, including: (a) fluorine; (b) lead; (c) zirconium; (d) titanium;

FIG. 7 shows the change in output voltage of the polymer-piezoceramic composite prepared by the present method according to certain embodiments of the present invention against different tapping pressures applied thereon at a loading frequency of 40 Hz, and a schematic of a tapping test setup (the inset);

FIG. 8 shows piezoelectric performances of the polymer-piezoceramic composite prepared by the present method according to certain embodiments of the present invention, in terms of (a) open-circuit voltage and (b) short-circuit current under 1.1 MPa compressive pressure at a loading frequency of 40 Hz;

FIG. 9 shows long-term deformation performance of the polymer-piezoceramic composite prepared by the present method according to certain embodiments of the present invention, in terms of the voltage responses during 50,000 cycles of compressive pressure at 0.5 MPa.

Skilled artisans will appreciate that elements in the figures are illustrated for simplicity and clarity and have not necessarily been depicted to scale.

DETAILED DESCRIPTION OF THE INVENTION

It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Figure 1:
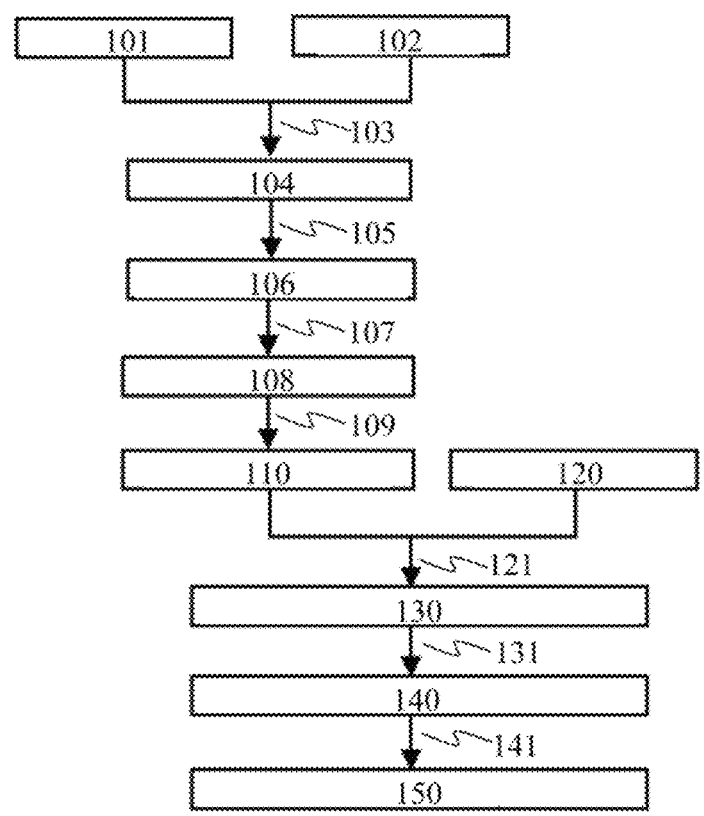
FIG. 1 illustrates as a flowchart key steps of the present method according to certain embodiments of the present invention.

Example 1—Preparation of the Polymer-Piezoceramic Composite and Piezoelectric Device Comprising Thereof Turning to FIG. 1, the key steps of preparing the present composite and corresponding piezoelectric device are summarized as a flowchart. Initially, a solid organic frame 101 and a liquid sol 102 including surface-modified piezoelectric materials are provided. In one embodiment, the liquid sol 102 is prepared as follows: sequentially preparing three types of liquids including (i) PZT sol solution, (ii) water-PZT powder suspension, and (iii) PZT sol-power suspension. For preparing (i) PZT [$Pb(Zr_{0.52}Ti_{0.48})O_3$] sol solution is firstly prepared by dissolving lead (II) acetate trihydrate with a 20% excess into acetic acid. After cooling down to room temperature, zirconium (IV) propoxide (70 wt % in 1-propanol) and titanium (IV) butoxide are separately added into the solution under continuously stirring. For preparing (ii) Water-PZT powder suspension, the PZT powder suspension and surfactant solution are respectively prepared by the addition of PZT powders and polyethyleneimine (PEI) into distilled water, which are then mixed under vigorous stirring to form water-PZT powder suspension, where the PZT powders are surface-modified by the surfactant. For preparing (iii) PZT sol-powder suspension, the (ii) water-PZT powder suspension are mixed with the (i) PZT sol solution in a mass ratio of 4:1 to form a well dispersed PZT suspension. The mass ratio is adjustable so as to tune the piezoelectric property, e.g., relative permittivity, of the resulting composite. In the subsequent examples, some other parameters that can be varied at different stages of the preparation method to optimize the piezoelectric and other properties of the resulting composite/device will be illustrated.

In FIG. 1, after the liquid sol 102 is prepared, the solid organic frame 101 is immersed into the liquid sol 102 to ensure that all surfaces of the solid organic frame 101 are fully covered by the liquid sol. There is no specific geometrical configuration for the solid organic frame 101. That being said, it can be in any two-dimensional or three-dimensional shape, either regular or irregular, depending on the needs and applications of the composite/device. After immersing the organic frame 101 into the liquid sol 102 for a sufficiently long duration to ensure that the liquid sol substantially occupies all the space (voids or cylinders) defined by the grids of the solid organic frame 101, the organic frame 101 is removed from the liquid sol 102. During the transition from liquid to air, due to surface tension exerted on the surface of the solid organic frame by the liquid sol (103), a continuous liquid film 104 is thereby formed. The continuous liquid film 104 containing the piezoelectric materials formed from the liquid sol on any surfaces of the organic frame 101 due to the surface tension effect is patterned (105) by a mask to form a patterned framework 106 complementary to a designated pattern of the mask. In an exemplary embodiment, a mask with a two-dimensional or three-dimensional pattern profile is used to cover the liquid film 104 prior to subjecting the liquid film 104 to airflow for drying out the residual liquid in air and formation of the patterned framework 106 and the subsequent drying (107) at a temperature that will transform the semi-dried liquid film with the patterned framework 106 from its sol state into a gel precursor 108. In an exemplary embodiment, the drying temperature during the sol-gel transformation (107) is about 70° C. when PZT is used as the piezoelectric material to formulate the sol system of the liquid film 104. In other embodiment, the drying temperature may vary depending on the composition of the sol system. The resulting patterned framework can be in different pattern profiles, depending on the pattern of the mask used. Some examples of two-dimensional and three-dimensional patterns are further illustrated in FIG. 3.

The gel precursor 108 having the patterned framework is further subject to sintering (109) in order to remove the organic frame 101 and subsequently form a piezoceramic film 110. In an embodiment, the sintering is carried out at a temperature of about 1,000° C. for about 2 hours. In other embodiments, the sintering conditions/parameters are in accordance with the composition of the gel precursor including the composition of the organic frame.

After cooling the piezoceramic film to a desired temperature, a prepared polymer liquid 120 which is curable by drying is added to the piezocermaic film as polymer fillers in order to fill up any remaining space of the patterned ceramic framework and form a continuous matrix enclosing the piezoceramic film (121). In one embodiment, the curable polymer liquid includes polyvinylidene fluoride (PVDF), polyimide (PI), thermoplastic polyurethane (TPU), styrene ethylene butylene styrene (SEBS), and polydimethylsiloxane (PDMS). The curable polymer liquid in that embodiment can be cured by drying at about 70° C. for about 2 hours. In other embodiments, the composition of the polymer matrix depends on the composition of the curable polymer liquid used, in order to tune the flexibility of the resulting polymer-piezoceramic composite, e.g., to optimize elastic modulus of the polymer matrix by adjusting the composition of the curable polymer liquid. In an exemplary embodiment, the polymer matrix has an elastic modulus (Young's modulus) of about 10 kPa to 2 GPa, with a relative permittivity of less than 10. The composition of the curable polymer liquid may vary in view of the desirable resulting Young's modulus of the polymer matrix. For example, PVDF results in a polymer matrix with Young's modulus of about 2 GPa; SEBS results in a polymer matrix with Young's modulus of about 5 to 50 MPa; PDMS results in a polymer matrix with Young's modulus of about 0.1 to about 10 MPa.

After the polymer liquid is totally cured, a composite 130 of the patterned piezoceramic film or framework associated with the polymer matrix is formed. In certain embodiments, the resulting composite has an elastic modulus of about 10 kPa to 10 GPa and a relative permittivity of about less than 10. These parameters are tunable, depending on the purpose of the composite and the performance requirements thereof.

To further fabricate into a piezoelectric device, protective layer and electrodes are coated on surfaces where patterned ceramic framework is formed (131) to obtain a polymer-piezoceramic composite coated with electrodes 140. In certain embodiments, the coating of electrodes and protective layer can be by sputtering, spin-coating, or any possible coating method commonly used by skilled artisans. In certain embodiments, the electrodes are made of one or more metals including, but not limited to, copper, silver and gold, or the compounds containing thereof. After the coating of electrodes and protective layer, the composite is subject to polarization (141), e.g., oil bath polarization, by applying a high voltage through an electrode, e.g., a needle electrode, across the electrode surface. In certain embodiments, the composite coated with the electrodes is polarized at about 110° C. for about 1 hour under an electric field of about 3 kV/cm followed by cooling down naturally to room temperature. As compared to prior art, only a relatively lower electric field than usual (could be up to 10 kV/cm in other piezoceramic composite) is needed to effectively polarize the present composite in the absence of adverse effect on electrical output of the resulting piezoelectric device 150 because there is substantially no permittivity difference between the polymer matrix and the piezoceramic framework in the present invention. In other embodiments, polarization such as corona polarization could be carried out prior to the coating of the electrodes and protective layer, and subsequently to the drying of the polymer-piezoceramic composite.

Figure 2:
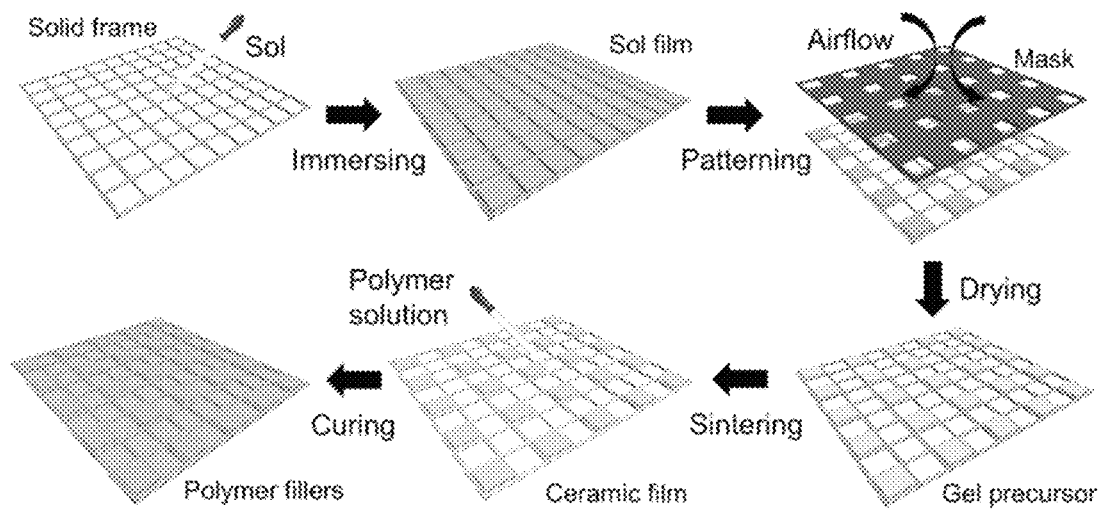
FIG. 2 schematically depicts the present method according to certain embodiments of the present invention.

FIG. 2 schematically depicts the present method according to an exemplary embodiment of the present invention to prepare a flexible, polymer-piezoceramic composite based on surface tension effect.

Figure 3:
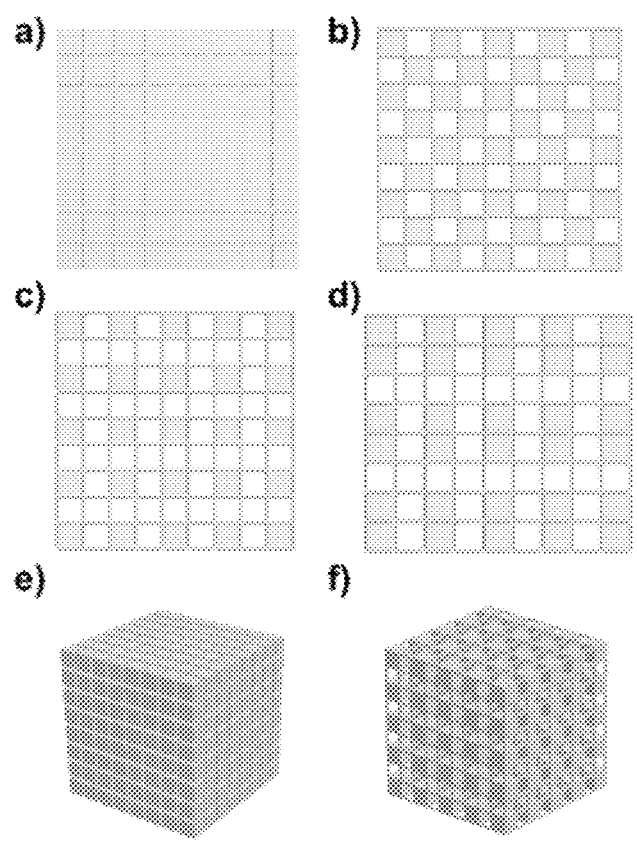
FIG. 3 illustrates from different perspectives the different patterns of the piezoceramic framework prepared according to various embodiments of the present invention, including: (a) continuous (2D pattern); (b) diamond (2D pattern); (c)

Turning to FIG. 3, some 2D patterns (panels a to d) and 3D patterns (panels e & f) on the piezoceramic framework prepared based on the surface tension assisted method to form the gel precursor from drying the respective liquid sol in the presence of a patterned mask are provided. For example, FIG. 3(*a*) provides a 2D continuous pattern; FIG. 3(*b*) provides a 2D diamond pattern; FIG. 3(*c*) provides an interval pattern by one grid apart from each other in 2D distributions; FIG. 3(*d*) provides a rectangular interval by one grid apart from every two vertical square grids in 2D distributions; FIG. 3(*e*) provides a 3D patterned structure with the 2D continuous pattern as shown in FIG. 3(*a*) on each surface thereof; FIG. 3(*f*) provides a 3D patterned structure with the 2D interval pattern as shown in FIG. 3(*c*) on each surface thereof.

Example 2—Characterization of Piezoceramic Framework and Polymer-Piezoceramic Composite Turning to FIG. 4, the morphology of the piezoceramic film with a 2D continuous pattern prepared by the present method according to certain embodiments of the present invention is studied by taking a series of SEM images from the top, bottom, and cross-sectional views of the film in different magnifications. In FIG. 4(*a*), it clearly shows that the space (voids or cylinders) of the patterned grid of the piezoceramic framework after the patterning. The inlet in FIG. 4(*a*) shows the bottom of the same composite, where the film is shown to be morphologically intact. FIG. 4(*b*) is a magnified top view of one of the patterned grids of the same film as in FIG. 4(*a*), which shows a dense grain-like structure microscopically. FIG. 4(*c*) shows a cross-sectional view of the same film as in FIG. 4(*a*). In this example, the thickness of the film is estimated to be about 200 μm.

Turning to FIG. 5, the morphology of the piezoceramic framework infiltrated with the polymer fillers by a PVDF-containing curable polymer liquid is studied by taking a series of SEM images after the polymer fillers are cured by drying. In FIG. 5(*a*), it shows that the polymer fillers (mainly PVDF) infiltrate any space and forms a continuous polymer matrix to enclose the piezoceramic framework. The inset of FIG. 5(*a*) shows a magnified view of one of the patterned grids, where the piezoceramic framework is shown to be covered by the polymer fillers. FIG. 5(*b*) shows a cross-sectional view of the same composite as in FIG. 5(*a*), in which the organic frame is removed by the sintering, resulting in a channel. The rest of the structures remain intact after the curing of the polymer fillers. In this example, the composite is shown to have a thickness of about 200 μm. The cured polymer matrix mostly containing PVDF also contributes some piezoelectric properties to the present composite, in addition to the piezoelectric elements in the piezoceramic framework. The PVDF-based polymer matrix also contributes certain elasticity to the resulting composite. In other words, adjusting the mass ratio between the piezoceramic framework and the polymer matrix can adjust the elastic modulus of the resulting composite, when needed, by changing the composition and/or concentration of the liquid sol used to form the piezoceramic film, and/or the composition/concentration of the polymer fillers infiltrated into the patterned piezoceramic framework.

To further study the distribution of different piezoelectric elements in the resulting composite, an energy dispersive spectrum (EDS) for each of the key elements is measured, and a map thereof is shown FIG. 6. FIG. 6(*b*) to (*d*) show that lead (Pb), zirconium (Zr) and titanium (Ti) have a homogenous distribution within the piezoceramic framework while FIG. 6(a) shows that fluorine (F) is mostly distributed in the polymer (PVDF) matrix. From these EDS maps, it suggests that the polymer matrix is substantially formed on the piezoceramic framework. It also demonstrates that the present method is able to prepare a homogenous piezoceramic framework in the absence of any tedious chemicals that are commonly used in conventional wet etching methods.

To demonstrate the piezoelectric properties of the present composite, a tapping test using different tapping forces ranging from 0.25 to 1.2 MPa at a loading frequency of 40 Hz is performed on the composite. The results and simple illustration of the experimental setup are shown in FIG. 7. The setup includes a vibration generator with a controlled oscillation frequency and taping force. The magnitude of the tapping force is adjustable by adjusting the distance between a tapping pillar and contact surface of the sample, which can be detected and quantified by mechanical force sensors. The piezoelectric output voltage and current are measured by a digital oscilloscope (Rohde & Schwarz RTE1024) and a low-noise current preamplifier (Stanford Research SR570), respectively. In the tapping test, when a compressive force is loaded under a tapping process with a frequency of 40 Hz, a high open-circuit voltage output occurs. FIG. 7 presents a nearly linear relationship between the electrical output of the piezoelectric device of the present invention and the applied mechanical force. As the applied compressive pressure increases, the electrical output of the present device increases substantially in a linear fashion. FIG. 8 shows the open-circuit voltage output (a) and short-circuit current (b) of the present device upon exerting a compressive pressure of about 1.1 MPa with a loading frequency of 40 Hz are approximately 75 V and 90 µA, respectively. In FIG. 8(a), it is also demonstrated that the present device also exhibits a relatively short response time (about 0.28 ms) but a longer release time (about 1.26 ms) due to the relatively low elastic modulus of the PVDF-based polymer matrix. In the context of using the present composite as a self-powered pressure sensor to provide anisotropic piezoelectric responses, due to various patterns that can be implemented to the piezoceramic framework, it is possible to combine different piezoelectric coefficients (e.g., $d_{33}$, $d_{31}$ and $d_{15}$) to detect transverse, longitudinal, and shear loads, respectively.

Turning to FIG. 9, the present composite is shown to have a good durability in a long-term deformation. The output voltage of the present device upon 50,000 tapping cycles of compression pressure at 0.5 MPa each is measured. The results in FIG. 9 suggest that the present composite still exhibits a constant electrical output upon receiving a long-term, repeated compression.

Although the invention has been described in terms of certain embodiments, other embodiments apparent to those of ordinary skill in the art are also within the scope of this invention. Accordingly, the scope of the invention is intended to be defined only by the claims which follow.

INDUSTRIAL APPLICABILITY

The present invention combining liquid surface tension with structural engineering techniques to improve both flexibility and piezoelectric response of the resulting composite over those prepared by conventional methods allows more customized patterns to be implemented on the piezoceramic framework, and eases the fabrication of free-standing piezoceramic films without complex transferring techniques as in other conventional methods, making the present invention easy to be scaled up for mass production. The present invention also allows easy tuning of mechanical and/or piezoelectric properties of the piezoelectric composite. The resulting composite of the present invention can be applied in a wide variety of electronics including wearables, portable devices, micro-robots, and healthcare devices which require self-power function and sufficient flexibility. Other potential applications of the present composite include being a high-performance energy harvester and high-sensitivity pressure sensor in some high energy demand and/or more complex systems.

What is claimed is:

1. A method of preparing a flexible, patterned piezoelectric composite through a surface tension assisted film forming procedure during a sol-gel process, the method comprising:
   providing an organic frame having a plurality of voids or cylinders defined by one or more grids thereof;
   providing piezoelectric liquids containing piezoelectric materials to form a sol solution;
   immersing the organic frame into the sol solution;
   removing the organic frame from the sol solution to air such that surface tensions between the piezoelectric liquids and the grids assist retention of the liquids within the voids or cylinders of the organic frame, thereby forming a liquid film;
   patterning the liquid film by a mask with a designated pattern under an airflow followed by drying at a first drying temperature to form a gel precursor;
   sintering the gel precursor at a sintering temperature to form a piezoceramic film;
   adding a curable liquid polymer solution to the piezoceramic film to form a curable liquid polymer matrix;
   drying the piezoceramic film with the curable liquid polymer matrix at a second drying temperature to form a polymer-piezoceramic composite.

2. The method of claim 1, wherein the piezoelectric liquids are provided by sequentially preparing the following three liquids:
   a piezoelectric material sol solution;
   a surface-modified piezoelectric powder suspension; and
   a piezoelectric material sol-powder suspension.

3. The method of claim 2, wherein the piezoelectric material sol solution is prepared by dissolving excessive lead (II) acetate trihydrate into an acetic acid solution, followed by adding zirconium (IV) propoxide and titanium (IV) butoxide into the solution until thoroughly mixed.

4. The method of claim 3, wherein the piezoelectric sol-powder suspension is prepared by mixing the surface-modified piezoelectric powder suspension with the piezoelectric material sol solution in a mass ratio to form a well-dispersed piezoelectric material sol-powder suspension.

5. The method of claim 2, wherein the surface-modified piezoelectric powder suspension is prepared by respectively adding piezoelectric powders and a surfactant solution comprising polyethyleneimine into water followed by mixing thoroughly such that the piezoelectric powders are surface-modified.

6. The method of claim 1, wherein the piezoelectric materials comprise one or more of lead zirconate titanate, barium titanate, barium titanate doped with calcium and zirconium, zinc oxide, and $Pb(Mg_{1/3}Nb_{2/3})O_3$—$PbTiO_3$.

7. The method of claim 1, wherein the first drying temperature used to dry the patterned liquid film is about 70° C. or at a temperature that turns the patterned liquid film into gel state.

8. The method of claim 1, wherein the mask used for the patterning is made of metal.

9. The method of claim 1, wherein the designated pattern of the mask is configured to provide either or both of two-dimensional and three-dimensional patterns in the patterning of the liquid film.

10. The method of claim 1, wherein the sintering temperature is about 1,000° C. for about 2 hours, or at a temperature and for a duration that the organic frame is substantially removed.

11. The method of claim 1, wherein the organic frame is a solid organic frame comprising one or more of nylon, polylactic acid, and polyimide.

12. The method of claim 1, wherein the second drying temperature is about 70° C. to dry the piezoceramic film with the curable liquid polymer matrix for about 2 hours or at a temperature and for a duration until the polymer-piezoceramic composite is set.

13. The method of claim 1, wherein the curable liquid polymer matrix comprises one or more of polyvinylidene fluoride, polyimide, thermoplastic polyurethane, styrene ethylene butylene styrene, and polydimethylsiloxane.

14. The method of claim 13, wherein the curable liquid polymer matrix is selected from a polyvinylidene fluoride polymer matrix.

15. The method of claim 1, further comprising coating one or more protective layers and one or more electrodes on the polymer-piezoceramic composite.

16. The method of claim 15, further applying a high electric field prior to or after coating the one or more protective layers and one or more electrodes on the polymer-piezoceramic composite.

17. The method of claim 15, wherein the one or more electrodes comprise copper, silver and gold; the electrodes and/or protective layer is/are coated by sputtering or spin-coating.

18. A piezoelectric composite prepared by the method of claim 1 with an elastic modulus from about 10 kPa to 10 GPa and a relative permittivity of less than 10.

19. A piezoelectric device comprising the piezoelectric composite of claim 18.

* * * * *